US012578486B2

(12) United States Patent
Costa et al.

(10) Patent No.: US 12,578,486 B2
(45) Date of Patent: Mar. 17, 2026

(54) X-RAY DETECTORS WITH NON-PERMANENT INTERCONNECTS

(71) Applicant: Varex Imaging Corporation, Salt Lake City, UT (US)

(72) Inventors: Marcelo C. Costa, Draper, UT (US); Paul Pryor, West Jordan, UT (US); Brian Crofts, Salt Lake City, UT (US); Ivan P. Mollov, Mountain View, CA (US); Richard Weisfield, Saratoga, CA (US); Rick E Colbeth, Los Altos, CA (US)

(73) Assignee: VAREX IMAGING CORPORATION, Salt Lake City, UT (US)

( * ) Notice: Subject to any disclaimer, the term of this patent is extended or adjusted under 35 U.S.C. 154(b) by 354 days.

(21) Appl. No.: 18/335,997

(22) Filed: Jun. 15, 2023

(65) Prior Publication Data

US 2024/0418874 A1    Dec. 19, 2024

(51) Int. Cl.
| | |
|---|---|
| *G01T 1/20* | (2006.01) |
| *H04N 5/32* | (2023.01) |
| *H04N 25/30* | (2023.01) |
| *H10F 39/18* | (2025.01) |
| *H10F 39/00* | (2025.01) |

(52) U.S. Cl.
CPC ....... *G01T 1/20182* (2020.05); *H10F 39/189* (2025.01); *H10F 39/809* (2025.01)

(58) Field of Classification Search
CPC .. G01T 1/20182; H10F 39/189; H10F 39/809
See application file for complete search history.

(56) References Cited

U.S. PATENT DOCUMENTS

| | | | |
|---|---|---|---|
| 2009/0121146 A1 | 5/2009 | Luhta et al. | |
| 2016/0148965 A1* | 5/2016 | Clayton | H10F 39/811 |
| | | | 257/293 |
| 2019/0196030 A1 | 6/2019 | Yang | |
| 2020/0145601 A1 | 5/2020 | Tsunai et al. | |

FOREIGN PATENT DOCUMENTS

| | | |
|---|---|---|
| EP | 0897597 | 2/1999 |
| EP | 0823132 | 4/1999 |

OTHER PUBLICATIONS

Int'l Appl. No. PCT/US2024/032693, International Search Report dated Sep. 26, 2024.
Int'l Appl. No. PCT/US2024/032693, Written Opinion dated Sep. 26, 2024.

* cited by examiner

*Primary Examiner* — Mark R Gaworecki
(74) *Attorney, Agent, or Firm* — Dorsey & Whitney LLP

(57) ABSTRACT

Some embodiments include an x-ray detector, comprising: a substrate including: a plurality of pixels; configured to convert incident x-ray into electrical signals; a plurality of data lines coupled to the pixels; a printed circuit assembly (PCA) including: a circuit configured to convert the electrical signals into digitized data; and an interconnect electrically connected between the data lines and the circuit and configured to transfer the electrical signals from the substrate to the PCA.

20 Claims, 8 Drawing Sheets

100

100

X-RAY DETECTORS WITH NON-PERMANENT INTERCONNECTS

X-ray detectors may include an array of pixels disposed on a substrate. Hundreds to thousands of data lines may be coupled to the array to enable the transfer of signals from the pixels. An interconnect including readout electronics may be bonded to the substrate with an anisotropic conductive film (ACF). The interconnect with the readout electronics may be electrically connected to a printed circuit assembly (PCA) with other circuits of the x-ray detector. A failure of the interconnect, a connection of the interconnect to the substrate, or the like may reduce the yield and/or increase the cost of manufacturing.

DETAILED DESCRIPTION

Embodiments include x-ray detectors with non-permanent interconnects. Some x-ray detectors include an array substrate with pixels configured to convert x-rays into electrical signals. An interconnect substrate on which an application specific integrated circuit (ASIC) is attached to the array substrate. The ASIC includes readout electronics configured to digitize analog signals from the pixels. The interconnect substrate is attached to the array substrate using an anisotropic conductive film (ACF). The interconnect substrate is often a flexible substrate that allows the printed circuit assembly (PCA) to fold under the array substrate to reduce the overall size of the x-ray detector and fit the detector array and supporting circuitry within a specified area or footprint.

Mounting ASICs on interconnect substrates may increase the cost of manufacturing. The attachment of the interconnect substrate to the array substrate may have a failure rate greater than 30%. When the attachment fails, the flexible interconnect with the ASIC is discarded, increasing the cost. In addition, the attachment process may need skilled technicians for alignment and bonding, specialized training for the technicians, specialized equipment, or the like. Each of these may increase the cost.

As described herein, embodiments alleviate the failure rate, increase the reliability of the connection, reduce scrap, simplify manufacturing, allow for automation, or the like.

Figure 1:
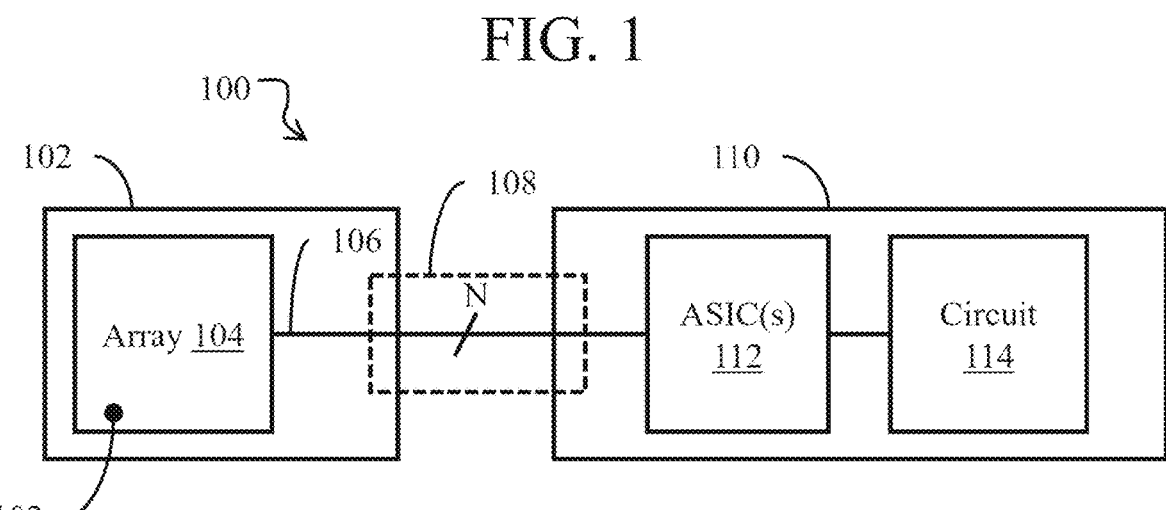
FIGS. 1-2 are block diagrams of an x-ray detector including an interconnect according to some embodiments.
Figure 2:
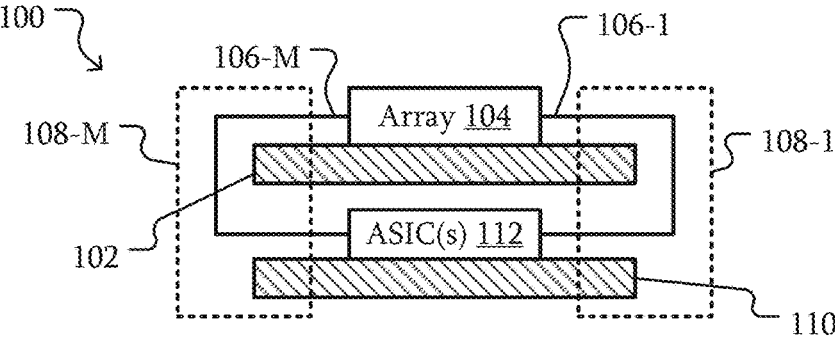

FIGS. 1-2 are block diagrams of an x-ray detector including an interconnect according to some embodiments. Referring to FIG. 1, in some embodiments, an x-ray detector 100 includes a substrate 102, an interconnect 108, and a printed circuit assembly (PCA) 110.

The substrate 102 includes an array 104 of pixels 103 configured to convert incident x-rays into electrical signals. The substrate 102 may include a rigid substrate such as glass, ceramic, metal, or the like. In other embodiments, the substrate 102 may include a flexible substrate such as polyimide (PI), polyethylene terephthalate (PET), or the like. Multiple data lines 106 are coupled to the pixels 103.

The PCA 110 is a device including a circuit configured to convert the electrical signals into digitized data. Digitized data can refer to voltage levels derived from analog electrical signals that represent binary numbers, such as "0" and "1." The ASIC(s) 112 represents this circuit (or readout electronics). The PCA 110 may include other circuits 114 such as processors, FPGAs, communication interfaces, memory, or the like. The circuit configured to convert the electrical signals into digitized data will be referred to as the ASIC 112 to distinguish that circuit from the circuit 114. Multiple ASICs 112 may be included in the PCA 110 and configured to convert the electrical signals into digitized data. These ASICs may be referred to as the ASIC 112.

The interconnect 108 is electrically connected between the data lines and the ASIC 112 and is configured to transfer the electrical signals to and from the substrate 102 to the PCA 110. In some embodiments, the interconnect 108 includes one-to-one electrical connections between the circuit 112 and an electrical structure on of the substrate 102 for the transfer of the electrical signals. For example, each data line 106 may be electrically connected to a trace on a flexible substrate that is part of the interconnect 108. Each of those traces may be electrically connected to a corresponding trace on the PCA 110 that is electrically connected to an input of the ASIC 112. The integer number N represents the data lines 106, electrical signal lines, or traces of the interconnect 108.

In some embodiments, the interconnect 108 includes a portion disposed on the substrate 102. In some embodiments, the interconnect 108 may include pads, connectors, or the like to connect the data lines 106 to the PCA 110. In some embodiments, a thickness of the portion of the interconnect 108 disposed on the substrate 102 is greater than a thickness of the data lines 106. For example, the data lines 106 may be metallized outside of the array 104 with tin, nickel, silver, gold, or other materials. As a result, the data lines 106 in the region outside of the array 104 may be thicker than data lines 106 within the array 104. This increased thickness may form part of the interconnect 108 to allow a better connection and wear to contacts, connectors, or the like. In some embodiments, the thickness of the portion of the interconnect 108 disposed on the substrate 102 is 5, 10, or 20 times greater than a thickness of the data lines 106 within the array 104. Conventionally, the data lines 106 are on the same side of the substrate 102 as the array 104. In some embodiments, the traces of the data lines 106 may extend or provide a conductive path to both sides of the substrate 102. The traces of the data lines 106 on opposite sides of the substrate 102 may use different conductive layers coupled with vias or other similar approaches.

Referring to FIG. 2, in some embodiments, the x-ray detector 100 may include multiple interconnects 108. Data lines 106 are not illustrated for clarity. In this example, M interconnects 108-1 to 108-M are illustrated. Each of the M interconnects 108 may include N data lines 106, traces, or other electrical connections as described above. The interconnects 108 are each electrically connected between the array 104 and the ASIC 112. Each interconnect 108 may be associated with a dedicated one of the ASICs 112; however, in other embodiments, each interconnect 108 may electrically connect to the same ASIC 112. While the array 104 is shown as layer on the substrate 102 for purposes of showing that the array 104 is smaller than the substrate 102, in some embodiments, the array 104 is integrated with the substrate 102.

Figure 3A:
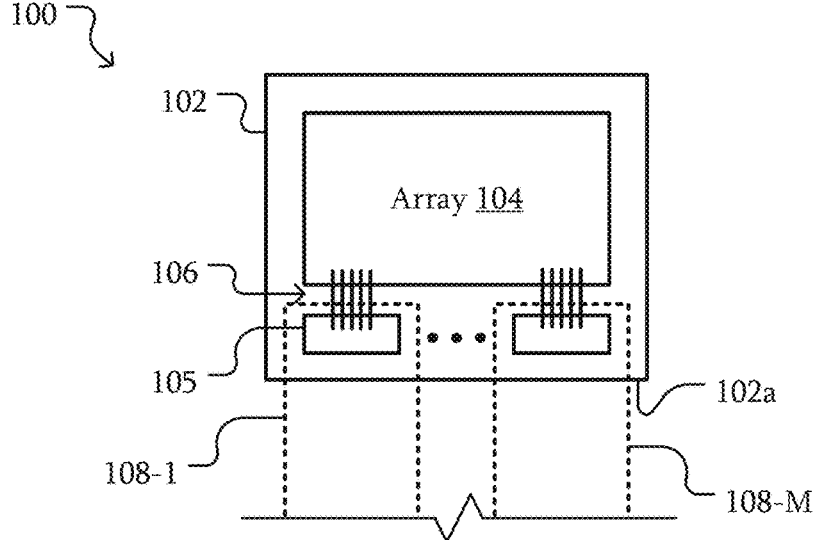
FIG. 3A-3B are block diagrams of an x-ray detector including an interconnect disposed on one side of a substrate according to some embodiments.
Figure 3B:
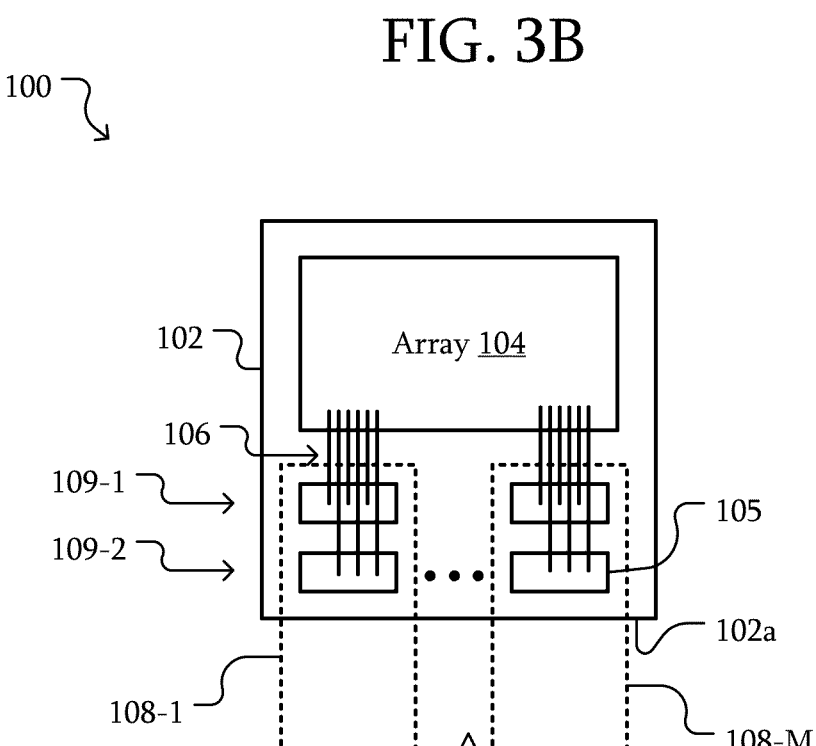

FIG. 3A-3B are block diagrams of an x-ray detector including an interconnect disposed on one side of a substrate according to some embodiments. Referring to FIG. 3A, in some embodiments, the x-ray detector 100 includes interconnects 108 disposed on one side 102a of the substrate 102. Data lines 106 may extend to connection locations 105 where the data lines 106 may be electrically connected to the interconnects 108.

Referring to FIG. 3B, in some embodiments, the interconnects 108 may be disposed in multiple rows 109. Two rows 109-1 and 109-2 are used as an example; however, in other embodiments, the number of rows 109 may be different. Each row 109 includes one or more interconnects 108.

In some embodiments, a pitch of a connector, pads, or the like on the substrate 102 may be too large to fit each data line 106 in one row 109 of interconnects 108, where pitch is the distance between conductors. Pitch includes the conductors and the spacing or insulator between the conductors. Accordingly, multiple interconnects 108 may be connected to the substrate 102 with a sufficient number to connect each of the data lines 106 to the PCA 110. Some data lines 106 may be coupled to interconnects 108 at connection locations 105 in one row 109 while others may be coupled to interconnects 108 in another row 109. As a result, the pitch of the data lines 106 at the connection locations 105 may be larger. The larger pitch may allow for more types of interconnections 108 to be used, different connectors, or the like. For example, a connector with the pitch of the data lines 106 at the array 104 may not be available. However, if the data lines 106 are divided among two or more rows 105, the pitch of the data lines 106 may be increased by the factor of two or more, allowing for the use of available connectors.

Figure 4:
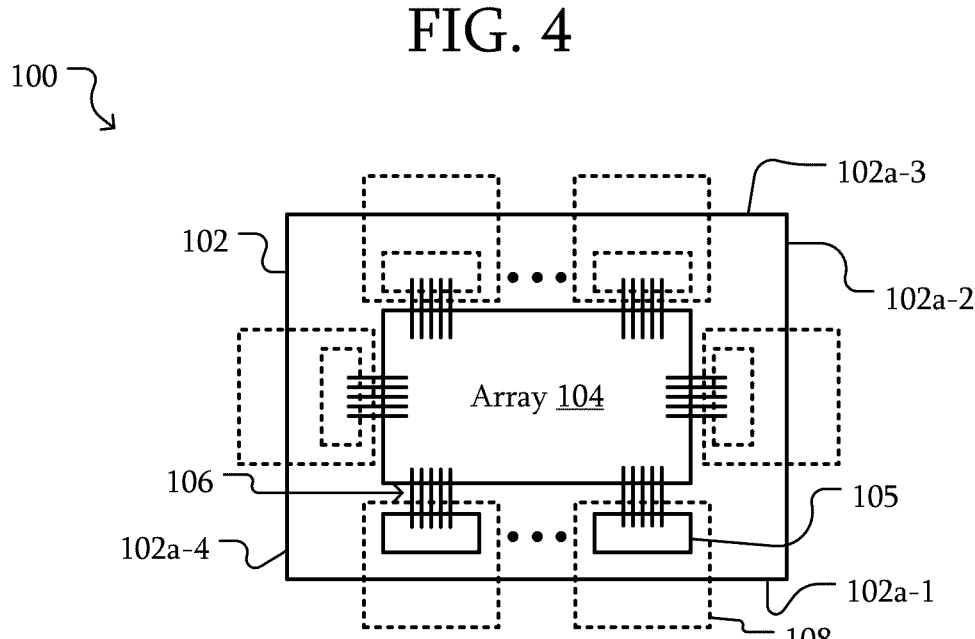
FIG. 4 is a block diagram of an x-ray detector including an interconnect disposed on multiple sides of a substrate according to some embodiments.

FIG. 4 is a block diagram of an x-ray detector including an interconnect disposed on multiple sides of a substrate according to some embodiments. In some embodiments, the x-ray detector 100 may be similar to the others described above; however, the substrate 102 is coupled to interconnects 108 on multiple edges 102a-1 to 102a-4. Although a substrate with 4 edges is used as an example, in other embodiments, the substrate 102 may have a different number of edges 102a. At least part of the interconnect(s) 108 are disposed on those multiple edges 102a.

Figure 5:
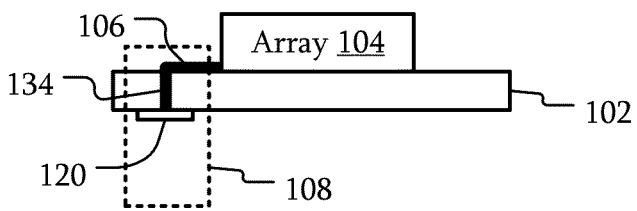
FIG. 5 is a block diagram of an x-ray detector including an interconnect with vias according to some embodiments.

FIG. 5 is a block diagram of an x-ray detector including an interconnect with vias according to some embodiments. In some embodiments, a portion 120 of the interconnect 108 is disposed on a side of the substrate 102 opposite to the array 104. The portion 120 may include pads, connectors, or the like. Multiple vias 134 may penetrate the substrate 102. In this example, the data lines 106 are coupled to the vias 134. The vias 134 are coupled to pads 120 that are part of the interconnect 108.

In some embodiments, the substrate 102 is flexible, such as a polyimide (PI) or polyethylene terephthalate (PET) substrate, or the like. Vias 134 may be formed through the polyimide. However, in other embodiments, the substrate 102 may be rigid and still include vias 134.

As described above, the interconnect 108 may be disposed in various locations on the substrate, along various edges 102a of the substrate 102, on different sides of the substrate 102, in various numbers, or the like. A variety of interconnects 108 will be described below with respect to FIGS. 6-12. Each of these will be described may be disposed in or include the various locations, edges 102a, sides, or numbers as described above.

If ACF is used to connect components and the interconnects 108, the substrate 102, ASIC 112, or the PCA 110, it may be difficult to repair or replace as the ACF may be only used once (e.g., may not be reused). In various embodiments described herein, the use of ACF may be eliminated. As a result, if the contacts of the interconnect 108 need to be disconnected, the disconnection does not result in the loss of the interconnect 108, the ASIC 106, or the like. In addition, the placement of the ASIC(s) 112 may reduce the loss if the interconnect 108 needs to be replaced. In some embodiments, connectors of the interconnect 108 may be semipermanent or removably coupled to the substrate 102 or the PCA 110.

In some embodiments, the interconnects 108 described herein include only passive electrical connections. Passive electrical connections include dissipative, storage, and energy-neutral components, such as conductors, resistors, capacitors, and inductors, and do not include active electrical components. Active electrical components include switching, amplifying, or electrical generating components, like transistors, integrated circuits, or the like.

Figure 6:
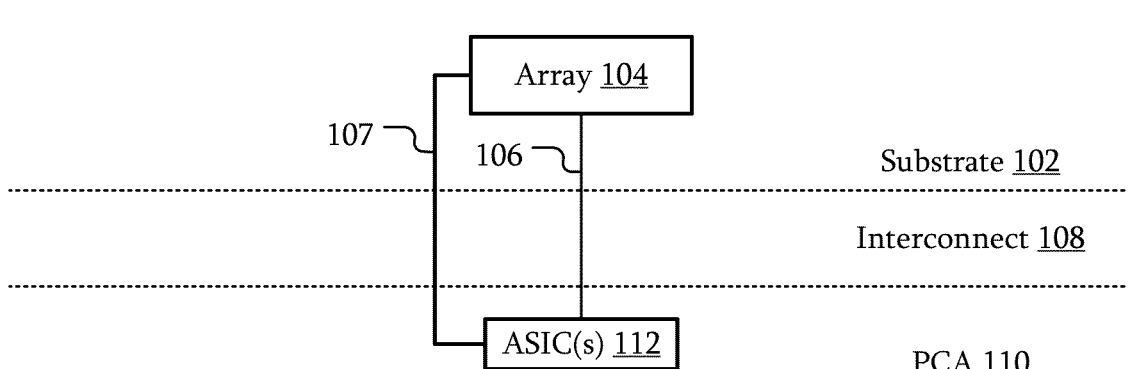
FIG. 6 is a block diagram of electrical connections between a substrate and a printed circuit assembly according to some embodiments.

FIG. 6 is a block diagram of electrical connections between a substrate and a printed circuit assembly according to some embodiments. In some embodiments, electrical connections that are formed between the substrate 102 and the PCA 110 may include electrical connections for signals other than electrical signals from the pixels 103 of the array 104.

In this example, the electrical connections include gate lines 107. The gate lines 107 may be coupled to the ASIC 112 similar to the data lines 106. However, in other embodiments, the gate lines 107 may be coupled to a separate gate line driver. Although the gate lines 107 have been used as an example of connections for other signals, the interconnect 108 may connect power, other control signals, reference voltages, or the like between the PCA 110 and the substrate 102.

Figure 7:
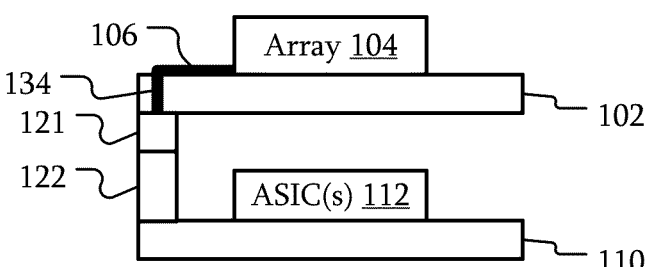
FIG. 7 is a block diagram of an x-ray detector including an interconnect with a compression connection according to some embodiments.

FIG. 7 is a block diagram of an x-ray detector including an interconnect with a compression connection according to some embodiments. In some embodiments, the substrate 102 includes contact pads 121. In this example, the contact pads 121 are disposed on a side of the substrate opposite to the array 104 and the data lines 106; however, in other embodiments, the contact pads 121 may be disposed on the same side as the array 104 and the data lines 106. The contact pads 121 are electrically connected to the data lines 106 through the vias 134.

Multiple compression contacts 122 are disposed on the PCA 110. Examples of the compression contacts 122 include pogo pins, z-axis interposers, z-axis interconnects, z-axis elastomeric connectors, or the like. The contact pads 121 and the compression contacts 122 are disposed such that when the substrate is aligned with the printed circuit assembly (with an alignment structure), the compression contacts 122 are compressed and make contact with the contact pads 121 of the substrate 102. The contact pads 121 and the compression contacts 122 form part of the interconnect 108. In some embodiments, more area may be available on the side of the substrate 102 opposite to the array 104 for interconnects 108.

In some embodiments, no ACF is used. The contact is created through the interface between the contact pads 121 and the compression contacts 122. The yield may improve when defective components need to be replaced. In the event of a failure, the compression may be removed. The contact may be recompressed. In addition, the contact pads 121 may be used for independent testing of the substrate 102 before connection to the PCA 110.

Figure 8:
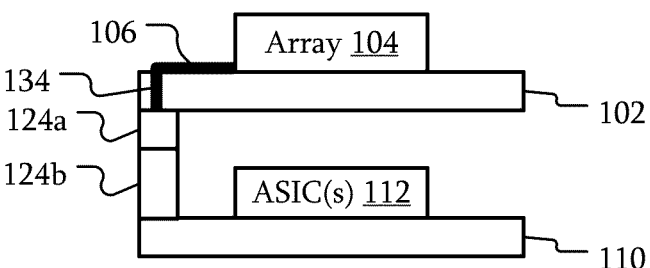
FIG. 8 is a block diagram of an x-ray detector including an interconnect with connectors according to some embodiments.

FIG. 8 is a block diagram of an x-ray detector including an interconnect with connectors according to some embodiments. In some embodiments, the substrate 102 includes a substrate connector 124a. The substrate connector 124a is electrically connected to the data lines 106. The substrate connector 124a includes a sufficient number of contacts to electrically connect the data lines 106 to the ASIC 112.

The PCA 110 includes a corresponding PCA connector 124b. The PCA connector is electrically connected to the ASIC 106. The PCA connector 124b is configured to mate with the substrate connector 124a. Accordingly, the substrate connector 124a and the PCA connector 124b may be mated to electrically connect the array 104 to the ASIC 106.

While a single pair of a substrate connector 124a and a PCA connector 124b has been used as an example, in other embodiments, multiple pairs of substrate connectors 124a and PCA connectors 124b may electrically connect the substrate 102 to the PCA 110.

In some embodiments, the substrate connector 124a allows for easier testing of the array 104. For example, a test system may include a connector similar to the PCA connector 124b. The connection may be more reliable and repeatable than other types of connections for testing that are attached to pads on the substrate 102 that would otherwise have been connected using ACF during final assembly.

In some embodiments, a single substrate connector 124a may include 256 terminals. As described above, multiple connectors 124a, multiple layers of connectors 124a, or the like may be present to reach a desired number of connections between the substrate 102 and the PCA 110.

In some embodiments, the substrate connectors 124a and PCA connectors 124b may be high density connectors, each with greater than 128 separate electrical contacts. The substrate connectors 124a and PCA connectors 124b may have a pitch that is smaller than other connectors (where other connectors have a pitch greater than 500 micrometers (μm)), but greater than the pitch the data lines 106. The pitch of a high density connector may have a pitch less than 500 μm, 450 μm, 400 μm, 350 μm, 300 μm, 250 μm, or 200 μm between contacts. The pitch of the data lines 106 may be on the order of 100 μm, 75 μm, or less. The pitch of the data lines 106 may be less than 150 μm, 120 μm, 110 μm, 100 μm, or 80 μm. In some embodiments, multiple connectors 124a in multiple rows 109 as described above may allow for substrate connectors 124a that have a higher pitch to fit within a desired width to be used. For example, a width of the substrate 102 may be limited to 43 centimeters (cm). About 4000 data lines 106 at a 100 μm pitch (i.e., approximately 40 cm) may fit within the 43 cm width. Multiple rows 109 of substrate connectors 124a with a larger pitch may be used to fit within that width. In other embodiments, the substrate connectors 124a may be disposed on multiple sides as described above.

Figure 9:
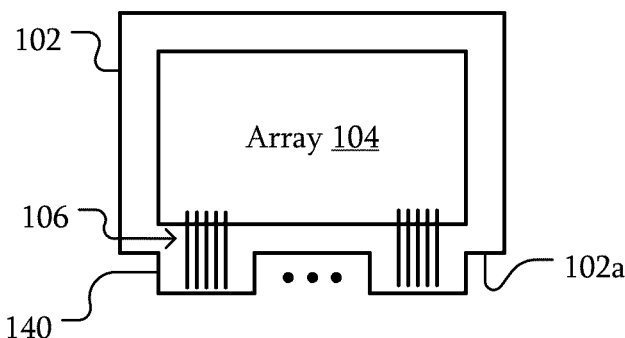
FIGS. 9-10B are block diagrams of an x-ray detector including an interconnect with protrusions according to some embodiments.
Figure 10A:
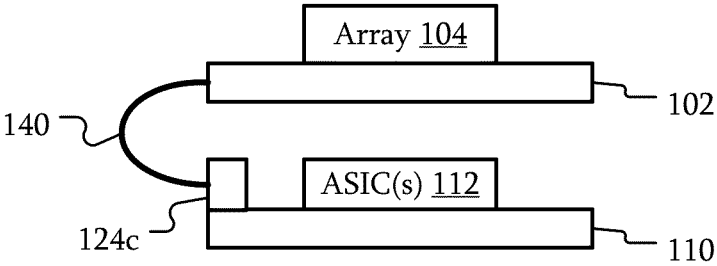
Figure 10B:
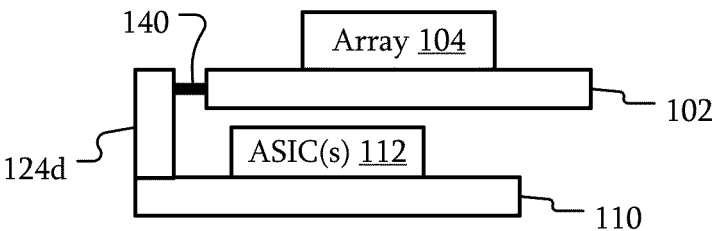

FIGS. 9-10B are block diagrams of an x-ray detector including an interconnect with protrusions (or ears or tabs) according to some embodiments. In some embodiments, the substrate 102 includes at least one protrusion 140. In this example, two protrusions are illustrated; however, in other embodiments, one or more than two may be included in the substrate 102.

The protrusion 140 is integrated with the substrate 102 to extend beyond a nominal side 102a of the substrate 102 or array 104. A protrusion 140 does not extend across the entire side 102a. A gap may exist between at least two protrusions.

A PCA connectors 124c and 124d are disposed on the PCA 110. The PCA connectors 124c and 124d may be similar to the PCA connector 124b described above; however, the PCA connectors 124c and 124d are configured to mate with a corresponding protrusion 140.

In some embodiments, the substrate 102 and/or the protrusion 140 may be flexible. Thus, the protrusion 140 may bend to be mated with the PCA connector 124c as illustrated in FIG. 10A. In some embodiments, the substrate 102 and the protrusion 140 may be rigid. The PCA connector 124d may be disposed on the PCA 110 such that the protrusion 140 may be mated with the PCA connector 124d without bending.

The data lines 106 are electrically connected to the protrusion 140. In some embodiments, the data lines 106 may form the contacts of the protrusion 140 that electrically connect with terminals of the PCA connectors 124c or 124d. In other embodiments, the data lines 106 may be electrically connected to terminals on the protrusion 140 that are configured to be electrically connect with terminals of the PCA connectors 124c or 124d.

Referring to FIG. 10A, in some embodiments, when mated, the protrusion 140 extends along an arc greater than 90 degrees. That is, the protrusion may begin extending from the substrate 102 parallel to a major plane of the substrate. However, along the length of the protrusion 140, the protrusion 140 bends in a direction that is more than 90 degrees different from the initial direction. In this example, the protrusion 140 extends along an arc that is about 180 degrees.

Referring to FIG. 10B, in some embodiments, the protrusion 140 is rigid. The protrusion 140 may extend parallel to the major plane of the substrate 102. The protrusion 140 may be inserted into the PCA connector 124d.

Figure 11:
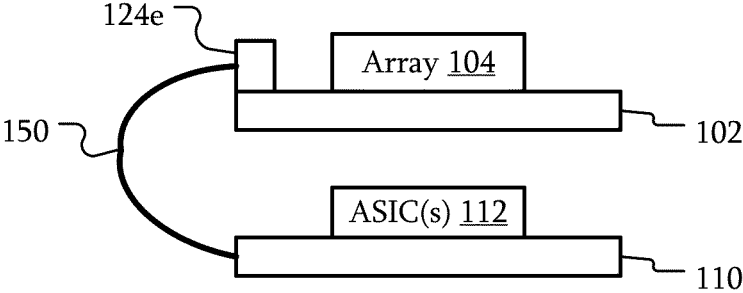
FIG. 11 is a block diagram of an x-ray detector including an interconnect with a PCA flexible circuit according to some embodiments.

FIG. 11 is a block diagram of an x-ray detector including an interconnect with a PCA flexible circuit according to some embodiments. In some embodiments, the PCA 110 may include a flexible circuit 150. The flexible circuit 150 may be integrated as a layer of the PCA 110, including traces, circuits, or the like that extend from other layers of the PCA 110. The substrate 102 includes a substrate connector 124e electrically coupled to the data lines 106. The flexible circuit 150 is configured to mate with the substrate connector 124e. The flexible circuit 150 and the substrate connector 124e form part of the interconnect 108. The ASIC 112 is further configured to receive the electrical signals through the flexible circuit 150.

Figure 12:
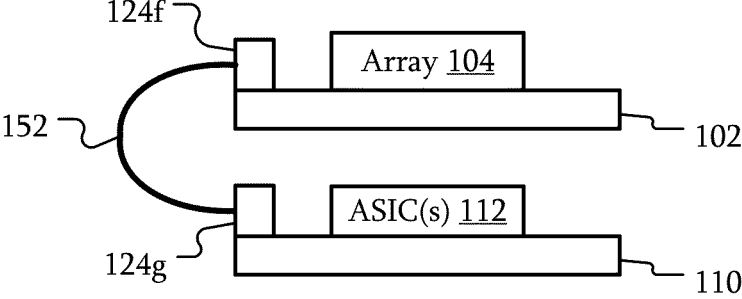
FIG. 12 is a block diagram of an x-ray detector including an interconnect with a flexible circuit according to some embodiments.

FIG. 12 is a block diagram of an x-ray detector including an interconnect with a flexible circuit 152 according to some embodiments. The flexible circuit 152 may include only passive components, no components, only traces, circuits, or the like. In some embodiments, the substrate 102 includes a substrate connector 124f electrically coupled to the data lines 106. The PCA 110 includes a PCA connector 124g electrically connected to the ASIC 112. Each of the substrate connector 124f and the PCA connector 124g is configured to mate with and electrically connect to the flexible circuit 152. The substrate connector 124f, the PCA connector 124g, and the flexible circuit 152 form part of the interconnect 108.

Figure 13:
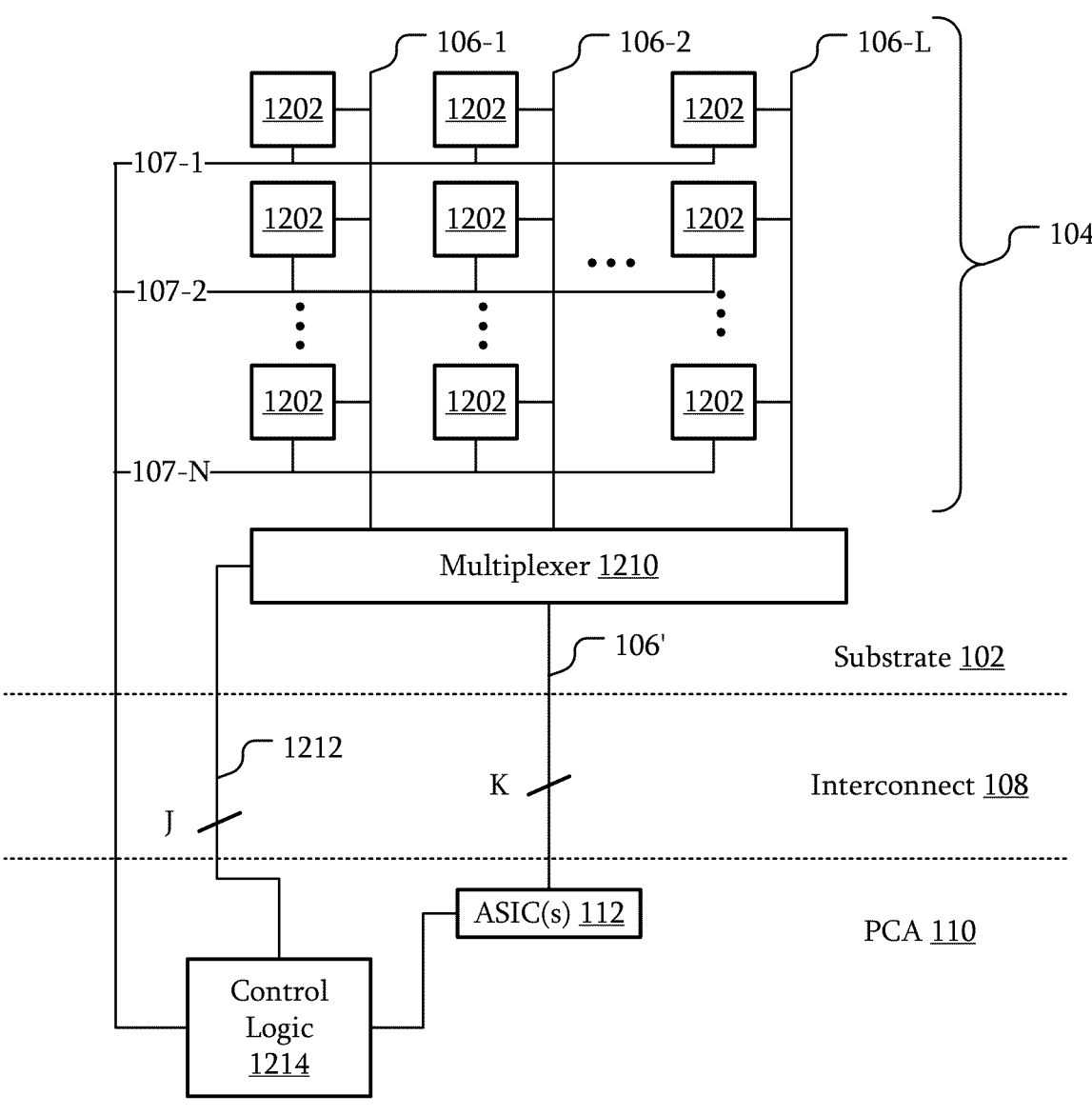
FIG. 13 is a block diagram of an x-ray detector including an interconnect and a multiplexer according to some embodiments.

FIG. 13 is a block diagram of an x-ray detector including an interconnect 108 and a multiplexer 1210 according to some embodiments. In some embodiments, the array 104 includes multiple pixels 1202. Each pixel 1202 may include circuitry configured to generate a desired signal based on incident radiation, such as x-rays. The pixel 1202 may include devices such as a photodiode, photodetector, a circuit including such devices, or the like. A scintillator, direct conversion material, or other x-ray conversion material may be part of the array 104 and configured to convert incident x-rays into photons that the pixel 1202 may convert into an electrical signal. For example, a scintillator may include a variety of materials configured to convert x-ray photons into photons detectable by the pixel 1202 such as cesium iodide (CsI), cadmium tungstate (CdWO$_4$), polyvinyl toluene (PVT), gadolinium oxysulfide (Gd$_2$O$_2$S; GOS; Gadox), gadolinium oxysulfide doped with terbium (Gd$_2$O$_2$S:Tb), or the like. Examples of direct conversion materials include cadmium telluride (CdTe), cadmium zinc telluride (CdZnTe or CZT), mercury iodide (HgI), lead iodide (PbI), selenium, or the like.

Each pixel is electrically connected to a corresponding one of the data lines 106 and gate lines 107. The data lines 106 are electrically connected to a multiplexer 1210. The multiplexer 1210 is a circuit configured to select less than all of the data lines 106 to electrically couple to the K conductors 106' of the interconnect 108. In some embodiments, the number L of data lines 106 may be 4096. The number K of conductors 106' of the interconnect 108 may be 1024. That is, the multiplexer 1210 may include 1024 individual 4:1 multiplexers.

The multiplexer 1210 may be configured to receive a control input 1212. The control input may include J control signals to select desired outputs of the multiplexer 1210. Using the example above of a multiplexer 1210 with multiple individual 4:1 multiplexers, the number J of control signals may be 2. Other circuitry of the array 104 may be configured to decode the 2 signals into a select signal for the individual multiplexers. In other embodiments, number of the J control signals may be 4 to directly control the individual multiplexers without decoding. Accordingly, based on the control input 1212, the multiplexer 1210 may be configured to multiplex the electrical signals on select data lines 106 into multiplexed electrical signals on the interconnect 108 conductors 106'.

The PCA 110 may include control logic 1214. The control logic 1214 may include a general purpose processor, a digital signal processor (DSP), an application specific integrated circuit (ASIC), a microcontroller, a programmable logic device, discrete circuits, a combination of such devices, or the like. The control logic 1214 may include other circuits to couple the control logic 1214 to the ASIC 112, the substrate 102, or the like to enable the control logic 1214 to control the operation of such circuits.

In some embodiments, the control logic 1214 is configured to control the gate lines 107 and the control input 1212 such that groups of the electrical signals on the data lines 106 are read by the ASIC 112 sequentially. Using the example above, a first group of 1024 signals from data lines 106-1, 106-5, . . . 106-1021 may be selected by the multiplexer 1210. Next, a second group of 1024 signals from data lines 106-2, 106-6, . . . 106-1022 may be selected by the multiplexer 1210 and so on until all data lines 106 have been selected and read out by the ASIC 106.

In some embodiments, using a multiplexer reduces the number of ASICs 112. If all of the signals from all data lines 106 are read simultaneously, an ASIC 112 or number of ASICs 112 with sufficient capacity must be used to process the electrical signals. By multiplexing the electrical signals from the data lines 112, the number of ASICs 112 needed may be reduced, such as by the multiplexing factor. Using the example above, the number of ASICs 112 may be reduced by a factor of 4. In some embodiments, the use of the multiplexer reduces the number of conductors for the interconnect 108. Reliability, yield, and cost may be affected by the number of conductors of the interconnect 108 and the number of ASICs 112. Reducing one or more may reduce the cost and increase reliability.

Figure 14:
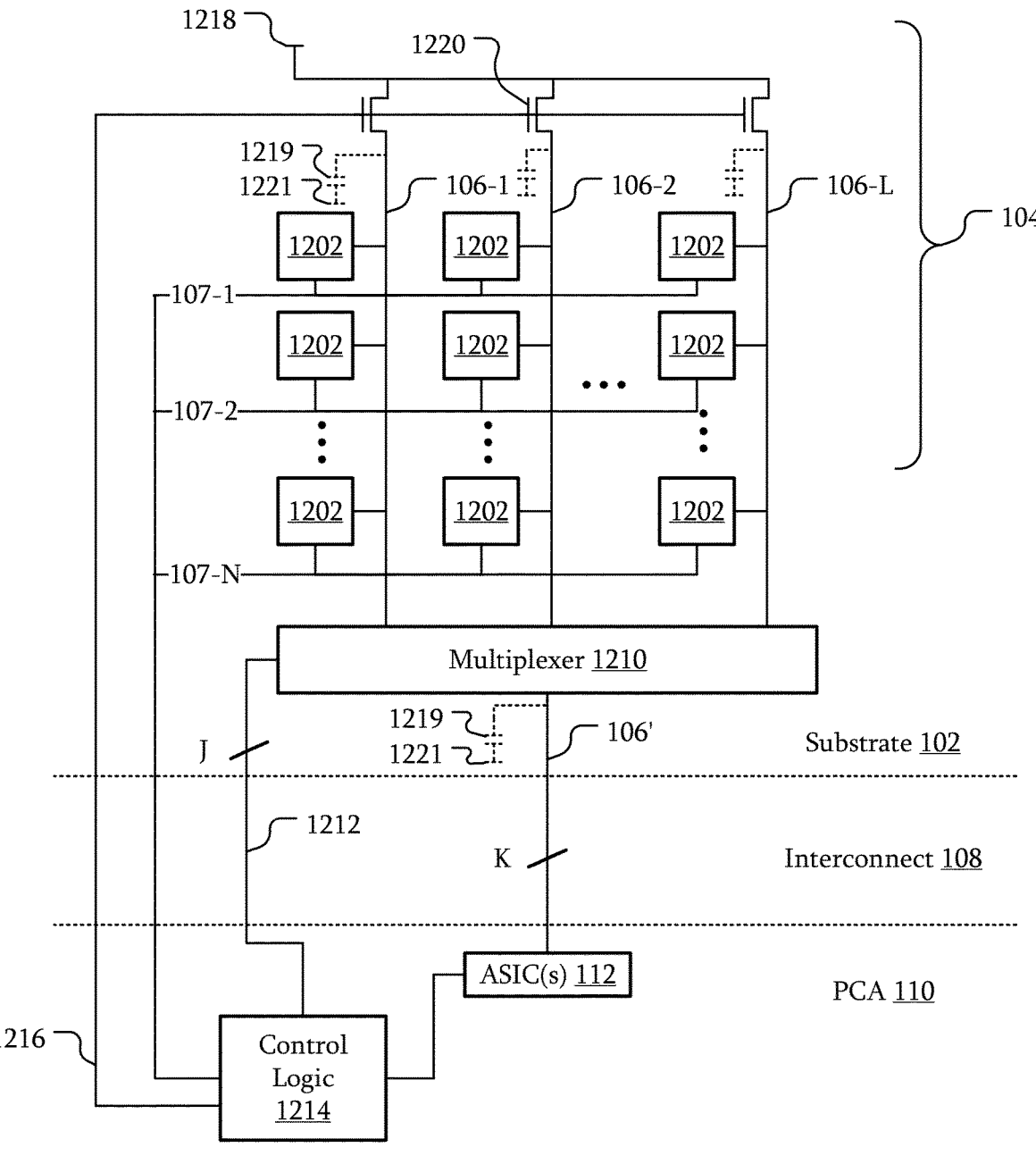
FIG. 14 is a block diagram of an x-ray detector including an interconnect and a multiplexer and a common node according to some embodiments.

FIG. 14 is a block diagram of an x-ray detector including an interconnect 108 and a multiplexer 1210 and a common node 1218 according to some embodiments. In some embodiments, the substrate 102 includes a common voltage node 1218. Multiple reset transistors 1220 may be coupled to the data lines 106. The reset transistors 1220 may be configured to selectively connect the data lines 106 to the common voltage node 1218.

In some embodiments, the reset transistors 1220 may reduce artifacts. The reset transistors may be controlled by the control logic 1214 through control signal 1216 such that when deselecting a row of pixels 1202, all the data lines 106 may be coupled to the common voltage node 1218. In some embodiments, all the inputs 1212 of the multiplexer 1210 may be activated at the same time.

In some embodiments, capacitors 1219 are electrically connected between a common voltage node 1221 and at least one of the data lines 106 and/or an output of the multiplexer 1210 at the conductors 106'. These capacitors 1219 may compensate for charge injection during selection of the multiplexer 1210 inputs. The capacitors may be used to compensate for parasitic charge resulting from the switching of the TFTs onto the data lines. The charge may come from parasitic capacitance created by array 104 trace overlaps from the pixels 1202 and data lines 106. Charge compensation capacitors 1219 on the array 104 may provide one of several techniques that can be used for charge compensation.

Figures 15, 16:
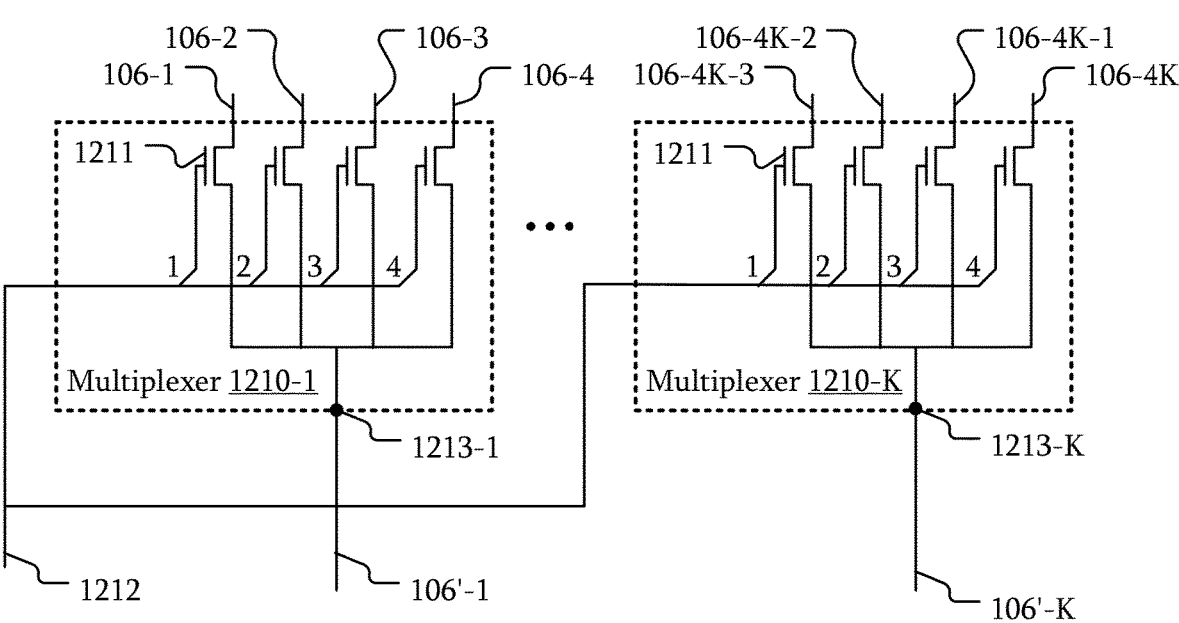
FIG. 15 is a block diagram of a specific multiplexer according to some embodiments.
FIG. 16 is a block diagram of an x-ray imaging system according to some embodiments.

FIG. 15 is a block diagram of a specific multiplexer according to some embodiments. In some embodiments, the multiplexer 1210 includes K individual multiplexers 1210-1 to 1210-K. Each individual multiplexer 1210 includes a select transistor 1211 coupled between a common output 1213 and a corresponding data line 106. The select transistors 1211 are coupled to a corresponding one of the control signals 1212. As a result, when control signal 1 of the control signals 1212 is activated, every 4$^{th}$ of the data lines 106-1 to 106-4K-3 are coupled to the corresponding common output 1213. Other data lines 106 may be coupled to the outputs based on different control signals 1212.

As described above, in some embodiments, all of the data lines 106 may be coupled to a common node. If each of the control signals 1-4 of control signals 1212 are activated at the same time, the data lines 106 may be coupled in common to the corresponding output 1213.

In some embodiments, the transistors 1211 may have a low resistance and parasitic capacitance. Examples of such transistors include thin film transistor (TFT) technologies, indium gallium zinc oxide (IGZO), polycrystalline silicon TFT, or the like.

In some embodiments the transistors 1211 are formed during the same process of forming any transistors of the pixels 1202, integrated with the pixels 1202, or the like. In other embodiments, the multiplexers 1210 may be discrete integrated circuits that are mounted to the substrate 102 through flip chip bonding, wire bonding, or the like. In other embodiments, the multiplexers 1210 may be formed of discrete transistors.

FIG. 16 is a block diagram of an x-ray imaging system according to some embodiments. The x-ray imaging system 1600 includes an x-ray source 1602 and detector 1610. The detector 1610 may include an x-ray detector 100 or the like as described above. In some embodiments, the x-ray source 1602 includes multiple field emitters (FE) 1624. Electron beams from the field emitters 1624 may be directed towards an anode 1626 to generate x-rays 1620. The x-ray source 1602 is disposed relative to the detector 1610 such that x-rays 1620 may be generated to pass through a specimen 1622 and detected by the detector 1610. In some embodiments, the detector 1610 is part of a medical imaging system. In other embodiments, the x-ray imaging system 1600 may include a portable vehicle scanning system as part of a cargo scanning system. The system 1600 may be any system that may include an x-ray detector.

An x-ray detector, comprising: a substrate 102 including: a plurality of pixels 1202; configured to convert incident x-ray into electrical signals; a plurality of data lines 106 coupled to the pixels 1202; a printed circuit assembly 110 (PCA 110) including: a circuit 112 configured to convert the electrical signals into digitized data; and an interconnect 108 electrically connected between the data lines 106 and the circuit 112 and configured to transfer the electrical signals from the substrate 102 to the PCA 110.

In some embodiments, at least two of the plurality of data lines 106 has a pitch less than 150 micrometers (µm).

In some embodiments, the substrate 102 further includes: a plurality of contact pads 121 coupled to the data lines 106 and forming part of the interconnect 108; and the printed circuit assembly 110 further includes: a plurality of compression contacts 122 forming part of the interconnect 108 and disposed on the printed circuit assembly 110 such that when the substrate 102 is aligned with the printed circuit assembly 110, the compression contacts 122 are compressed and make contact with the contact pads 121 of the substrate 102.

In some embodiments, the x-ray detector further comprises a plurality of vias 134 penetrating the substrate 102; wherein: the contact pads 121 are disposed on a side of the substrate 102 opposite to the data lines 106; and the vias 134 electrically connect the contact pads 121 to the data lines 106.

In some embodiments, the substrate 102 further includes: a substrate connector 124a and forming part of the interconnect 108 and electrically connected to the data lines 106; and the printed circuit assembly 110 further includes: a PCA connector 124a forming part of the interconnect 108 and electrically connected to the circuit 112 and configured to mate with the substrate connector 124a.

In some embodiments, the substrate 102 further includes: at least one protrusion 140 forming part of the interconnect 108 and integrated with the substrate 102 and extending from the substrate 102, the protrusion 140 including contacts electrically coupled to the data lines 106; and the printed circuit assembly 110 further includes: at least one PCA connector 124c, 124d forming part of the interconnect 108 and electrically connected to the circuit 112, each of the at least one PCA connector 124c, 124d is configured to mate with a corresponding one of the at least one protrusion 140.

In some embodiments, when mated, the at least one protrusion 140 extends along an arc greater than 90 degrees.

In some embodiments, the substrate 102 further includes: at least one substrate connector 124e forming part of the interconnect 108 and electrically coupled to the data lines 106; and the printed circuit assembly 110 further includes: a printed circuit 112 board integrated with a flexible circuit 150 forming part of the interconnect 108 and configured to mate with the at least one substrate 102 connector; wherein the circuit 112 is further configured to receive the electrical signals through the flexible circuit 150.

In some embodiments, the substrate 102 further includes: at least one substrate connector 124f forming part of the interconnect 108 and electrically coupled to the data lines 106; the printed circuit assembly 110 further includes: at least one PCA connector 124g forming part of the interconnect 108 and electrically connected to the circuit 112; and the interconnect 108 further comprises a flexible circuit 152 electrically connected between the at least one substrate connector 124f and the at least one PCA connector 124g.

In some embodiments, when mated, the flexible circuit 112 extends along an arc greater than 90 degrees.

In some embodiments, the flexible circuit 150, 152 includes only passive electrical connections.

In some embodiments, the interconnect 108 includes a high density connector with a pitch less than 500 microm-eters (µm) between contacts.

In some embodiments, the substrate 102 further includes: a multiplexer 1210 electrically connected to the data lines 106 and configured to multiplex the electrical signals into multiplexed electrical signals.

In some embodiments, the multiplexer 1210 includes at select input; the circuit 112 includes a select output; and the interconnect 108 includes electrical connections electrically connected between the select input and the select output.

In some embodiments, the substrate 102 further includes: a common voltage node 1218; and reset transistors 1220 configured to selectively connect the data lines 106 to the common voltage node 1218.

In some embodiments, the multiplexer 1210 includes at least one discrete integrated circuit.

In some embodiments, the multiplexer 1210 includes components integrated with the substrate 102 and formed during a process of forming the pixels 1202.

In some embodiments, the substrate 102 further includes: a common voltage node 1221; and capacitors 1219 electri-cally connected between the common voltage node 1221 and at least one of the data lines 106 and an output of the multiplexer 1210.

In some embodiments, at least part of the interconnect 108 is disposed on multiple edges of the substrate 102.

In some embodiments, the interconnect 108 includes one-to-one electrical connections between the circuit 112 and an electrical structure on of the substrate 102.

In some embodiments, the interconnect 108 further includes a portion disposed on the substrate 102; and a thickness of the portion of the interconnect 108 disposed on the substrate 102 is at least two times greater than a thickness of the data lines 106.

Some embodiments include a method, comprising: generating electrical signals in response to x-rays incident on pixels of a substrate; transmitting the electrical signals from the pixels via a plurality of data lines through an interconnect; receiving the electrical signals at a circuit on a printed circuit assembly (PCA) through the interconnect; and converting the electrical signals into digitized data with the circuit.

In some embodiments, the method further comprises multiplexing the electrical signals before transmitting the electrical signals through the interconnect.

An x-ray detector, comprising: means for generating electrical signals in response to x-rays incident on pixels of a substrate; means for transmitting the electrical signals from the pixels via a plurality of data lines through an interconnect; means for receiving the electrical signals at a circuit on a printed circuit assembly (PCA) through the interconnect; and means for converting the electrical signals into digitized data with the circuit.

In some embodiments, the x-ray detector further comprises: means for multiplexing the electrical signals before transmitting the electrical signals through the interconnect.

Although the structures, devices, methods, and systems have been described in accordance with particular embodiments, one of ordinary skill in the art will readily recognize that many variations to the particular embodiments are possible, and any variations should therefore be considered to be within the spirit and scope disclosed herein. Accordingly, many modifications may be made by one of ordinary skill in the art without departing from the spirit and scope of the appended claims.

The claims following this written disclosure are hereby expressly incorporated into the present written disclosure, with each claim standing on its own as a separate embodiment. This disclosure includes all permutations of the independent claims with their dependent claims. Moreover, additional embodiments capable of derivation from the independent and dependent claims that follow are also expressly incorporated into the present written description. These additional embodiments are determined by replacing the dependency of a given dependent claim with the phrase "any of the claims beginning with claim [x] and ending with the claim that immediately precedes this one," where the bracketed term "[x]" is replaced with the number of the most recently recited independent claim. For example, for the first claim set that begins with independent claim 1, claim 4 can depend from either of claims 1 and 3, with these separate dependencies yielding two distinct embodiments; claim 5 can depend from any one of claim 1, 3, or 4, with these separate dependencies yielding three distinct embodiments; claim 6 can depend from any one of claim 1, 3, 4, or 5, with these separate dependencies yielding four distinct embodiments; and so on.

Recitation in the claims of the term "first" with respect to a feature or element does not necessarily imply the existence of a second or additional such feature or element. Elements specifically recited in means-plus-function format, if any, are intended to be construed to cover the corresponding structure, material, or acts described herein and equivalents thereof in accordance with 35 U.S.C. § 112(f). Embodiments of the invention in which an exclusive property or privilege is claimed are defined as follows.

The invention claimed is:

1. An x-ray detector comprising:
a substrate including:
    a plurality of pixels configured to convert incident x-rays into electrical signals;
    a plurality of data lines coupled to the pixels;
    a plurality of contact pads disposed on a side of the substrate opposite to the pixels; and
    a plurality of vias penetrating the substrate and connecting the contact pads to the data lines;
a printed circuit assembly (PCA) including:
    a circuit configured to convert the electrical signals into digitized data; and
an interconnect electrically connected between the data lines and the circuit and configured to transfer the electrical signals from the substrate to the PCA.

2. The x-ray detector of claim 1, wherein at least two of the data lines of the plurality of data lines have a pitch less than 150 micrometers ($\mu$m).

3. The x-ray detector of claim 1, wherein:
the
    contact pads form part of the interconnect; and
the printed circuit assembly further includes:
    a plurality of compression contacts forming part of the interconnect and disposed on the printed circuit assembly such that when the substrate is aligned with the printed circuit assembly, the compression contacts are compressed and make contact with the contact pads of the substrate.

4. The x-ray detector of claim 3, wherein:
the contact pads are disposed on a side of the substrate opposite to the data lines.

5. The x-ray detector of claim 1, wherein:
the substrate further includes:
    a substrate connector forming part of the interconnect and electrically connected to the data lines; and
the printed circuit assembly further includes:
    a PCA connector forming part of the interconnect, electrically connected to the circuit, and configured to mate with the substrate connector.

6. The x-ray detector of claim 1, wherein:
the substrate further includes:
    at least one protrusion forming part of the interconnect, integrated with the substrate, and extending from the substrate, the protrusion including contacts electrically coupled to the data lines; and
the printed circuit assembly further includes:
    at least one PCA connector forming part of the interconnect and electrically connected to the circuit, each of the at least one PCA connector is configured to mate with a corresponding one of the at least one F.

7. The x-ray detector of claim 1, wherein:
the substrate further includes:
    at least one substrate connector forming part of the interconnect and electrically coupled to the data lines; and
the printed circuit assembly further includes:
    a printed circuit board integrated with a flexible circuit forming part of the interconnect and configured to mate with the at least one substrate connector;
    wherein the circuit is further configured to receive the electrical signals through the flexible circuit.

8. The x-ray detector of claim 1, wherein:
the substrate further includes:

at least one substrate connector forming part of the interconnect and electrically coupled to the data lines;

the printed circuit assembly further includes:

at least one PCA connector forming part of the interconnect and electrically connected to the circuit; and the interconnect further comprises a flexible circuit electrically connected between the at least one substrate connector and the at least one PCA connector.

9. The x-ray detector of claim 8, wherein:

the flexible circuit includes only passive electrical connections.

10. The x-ray detector of claim 1, wherein the interconnect includes a high density connector with a pitch less than 500 micrometers (µm) between contacts.

11. The x-ray detector of claim 1, wherein:

the substrate further includes:

a multiplexer electrically connected to the data lines and configured to multiplex the electrical signals into multiplexed electrical signals.

12. The x-ray detector of claim 11, wherein:

the multiplexer includes at select input;

the circuit includes a select output; and the interconnect includes electrical connections electrically connected between the select input and the select output.

13. The x-ray detector of claim 11, wherein:

the substrate further includes:

a common voltage node; and reset transistors configured to selectively connect the data lines to the common voltage node.

14. The x-ray detector of claim 11, wherein:

the multiplexer includes components integrated with the substrate.

15. The x-ray detector of claim 11, wherein:

the substrate further includes:

a common voltage node; and capacitors electrically connected between the common voltage node and at least one of the data lines and an output of the multiplexer.

16. The x-ray detector of claim 1, wherein:

at least part of the interconnect is disposed on multiple edges of the substrate.

17. The x-ray detector of claim 1, wherein:

the interconnect includes one-to-one electrical connections between the circuit and an electrical structure of the substrate.

18. A method comprising:

generating electrical signals in response to x-rays incident on pixels of a substrate;

transmitting the electrical signals from the pixels via a plurality of data lines through an interconnect;

receiving the electrical signals at a circuit on a printed circuit assembly (PCA) through the interconnect, the interconnect comprising a flexible circuit electrically connected between the data lines and the PCA; and converting the electrical signals into digitized data with the circuit.

19. An x-ray detector comprising:

a substrate comprising a plurality of pixels for generating electrical signals in response to x-rays incident on the pixels;

a plurality of data lines for transmitting the electrical signals from the pixels through an interconnect; and a circuit on a printed circuit assembly (PCA) for receiving the electrical signals through the interconnect and converting the electrical signals into digitized data, wherein the interconnect comprises:

a protrusion extending from one of the substrate or the PCA; and a connector on the other of the substrate or the PCA and configured to mate with the protrusion, the protrusion and the connector connecting the data lines and the circuit.

20. The x-ray detector of claim 19, further comprising:

a multiplexer for multiplexing the electrical signals before transmitting the electrical signals through the interconnect.

* * * * *